US010553507B2

United States Patent
Ono et al.

(10) Patent No.: US 10,553,507 B2
(45) Date of Patent: Feb. 4, 2020

(54) CONTROL DEVICE AND CONTROL METHOD OF SEMICONDUCTOR MANUFACTURING APPARATUS

(71) Applicant: TOSHIBA MEMORY CORPORATION, Minato-ku, Tokyo (JP)

(72) Inventors: Syunichi Ono, Mie (JP); Tsutomu Miki, Mie (JP); Kenichi Otsuka, Ishikawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 297 days.

(21) Appl. No.: 15/252,894

(22) Filed: Aug. 31, 2016

(65) Prior Publication Data

US 2017/0263512 A1   Sep. 14, 2017

(30) Foreign Application Priority Data

Mar. 11, 2016 (JP) .................................. 2016-048663

(51) Int. Cl.
   *H01L 21/66* (2006.01)
   *H01L 21/67* (2006.01)
   *H01L 21/304* (2006.01)

(52) U.S. Cl.
   CPC ........ *H01L 22/26* (2013.01); *H01L 21/67092* (2013.01); *H01L 21/67253* (2013.01); *H01L 21/304* (2013.01)

(58) Field of Classification Search
   CPC ............. H01L 21/304; H01L 21/67092; H01L 21/67253; H01L 22/26; H01L 22/12; B24B 37/013
   See application file for complete search history.

(56) References Cited

U.S. PATENT DOCUMENTS

| | | | | |
|---|---|---|---|---|
| 5,271,274 | A | * | 12/1993 | Khuri-Yakub ....... G01B 17/025 73/597 |
| 6,091,000 | A | * | 7/2000 | Haynes .............. A61K 49/0008 424/9.2 |
| 6,312,994 | B1 | | 11/2001 | Nakamura |
| 6,564,116 | B2 | * | 5/2003 | Wang ................... G05B 13/027 156/345.12 |
| 2003/0049993 | A1 | | 3/2003 | Fujii |
| 2013/0017763 | A1 | | 1/2013 | Takaishi et al. |
| 2015/0360343 | A1 | | 12/2015 | Yavelberg |

FOREIGN PATENT DOCUMENTS

| | | |
|---|---|---|
| JP | H06-045299 A | 2/1994 |
| JP | H06-320416 A | 11/1994 |
| JP | 2001-015467 A | 1/2001 |

(Continued)

*Primary Examiner* — Elias Desta
(74) *Attorney, Agent, or Firm* — Foley & Lardner LLP

(57) ABSTRACT

A control device of a semiconductor manufacturing apparatus includes a processor and a memory connected to the processor and storing instructions executable by the processor. The instructions collect a sound of processing a substrate by the semiconductor manufacturing apparatus. The instructions calculate a difference of a power spectrum of the processing sound between a first point of time and a second point of time. The instructions determine a change point of processing of the substrate based on the difference.

16 Claims, 14 Drawing Sheets

(56) References Cited

FOREIGN PATENT DOCUMENTS

| | | |
|---|---|---|
| JP | 2003-037090 A | 2/2003 |
| JP | 2003-086551 A | 3/2003 |
| JP | 2004-363229 A | 12/2004 |
| JP | 2013-221755 A | 10/2013 |
| JP | 2015-094620 A | 5/2015 |
| WO | WO 2011/068236 A1 | 6/2011 |
| WO | WO 2015/195284 A1 | 12/2015 |

* cited by examiner

US 10,553,507 B2

1

CONTROL DEVICE AND CONTROL METHOD OF SEMICONDUCTOR MANUFACTURING APPARATUS

CROSS-REFERENCE TO RELATED APPLICATION

This application is claims the benefit of and priority to Japanese Patent Application No. 2016-048663, filed on Mar. 11, 2016, the entire contents of which are incorporated herein by reference.

FIELD

Embodiments described herein relate generally to a control device and a control method of a semiconductor manufacturing apparatus.

BACKGROUND

In a case where a surface of a wafer is ground by a grinding device, when a process target layer which is formed on a stopper layer is ground, the grinding can be stopped by detecting an end point (or a change point) of the grinding through a certain detection method. Improvements in such detection method remain desired.

SUMMARY

In some embodiments according to one aspect, a control device of a semiconductor manufacturing apparatus may include a processor and a memory connected to the processor and storing instructions executable by the processor. The instructions may collect a sound of processing a substrate by the semiconductor manufacturing apparatus. The instructions may calculate a difference of a power spectrum of the processing sound between a first point of time and a second point of time. The instructions may determine a change point of processing of the substrate based on the difference.

In some embodiments according to another aspect, a control method of a semiconductor manufacturing apparatus may include collecting a sound of processing a substrate by the semiconductor manufacturing apparatus. A difference of a power spectrum of the processing sound between a first point of time and a second point of time may be calculated. A change point of processing of the substrate may be determined based on the difference. Processing of the substrate by the semiconductor manufacturing apparatus may be controlled based on the change point.

Other aspects and embodiments of the disclosure are also encompassed.

The foregoing summary and the following detailed description are not meant to restrict the disclosure to any particular embodiment but are merely meant to describe some embodiments of the disclosure.

2

Figure 4:
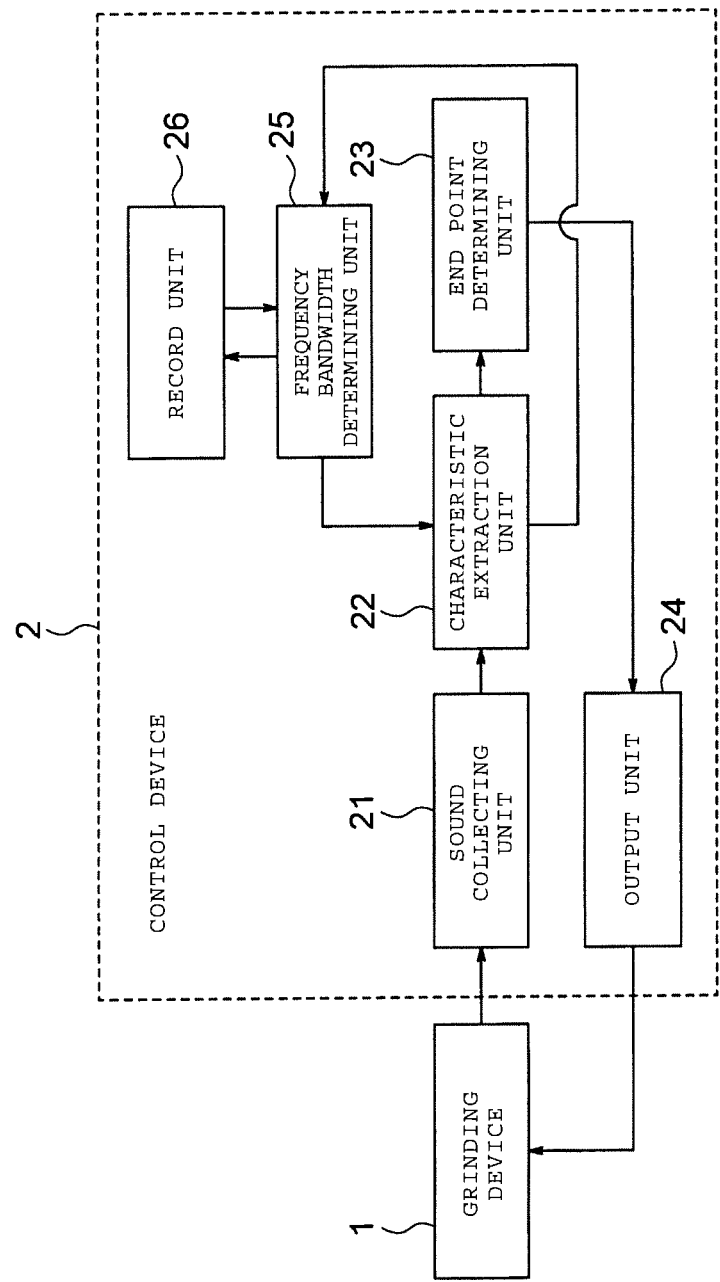

FIG. 4 is a block diagram illustrating a configuration of a control device according to some embodiments.

Figure 5:
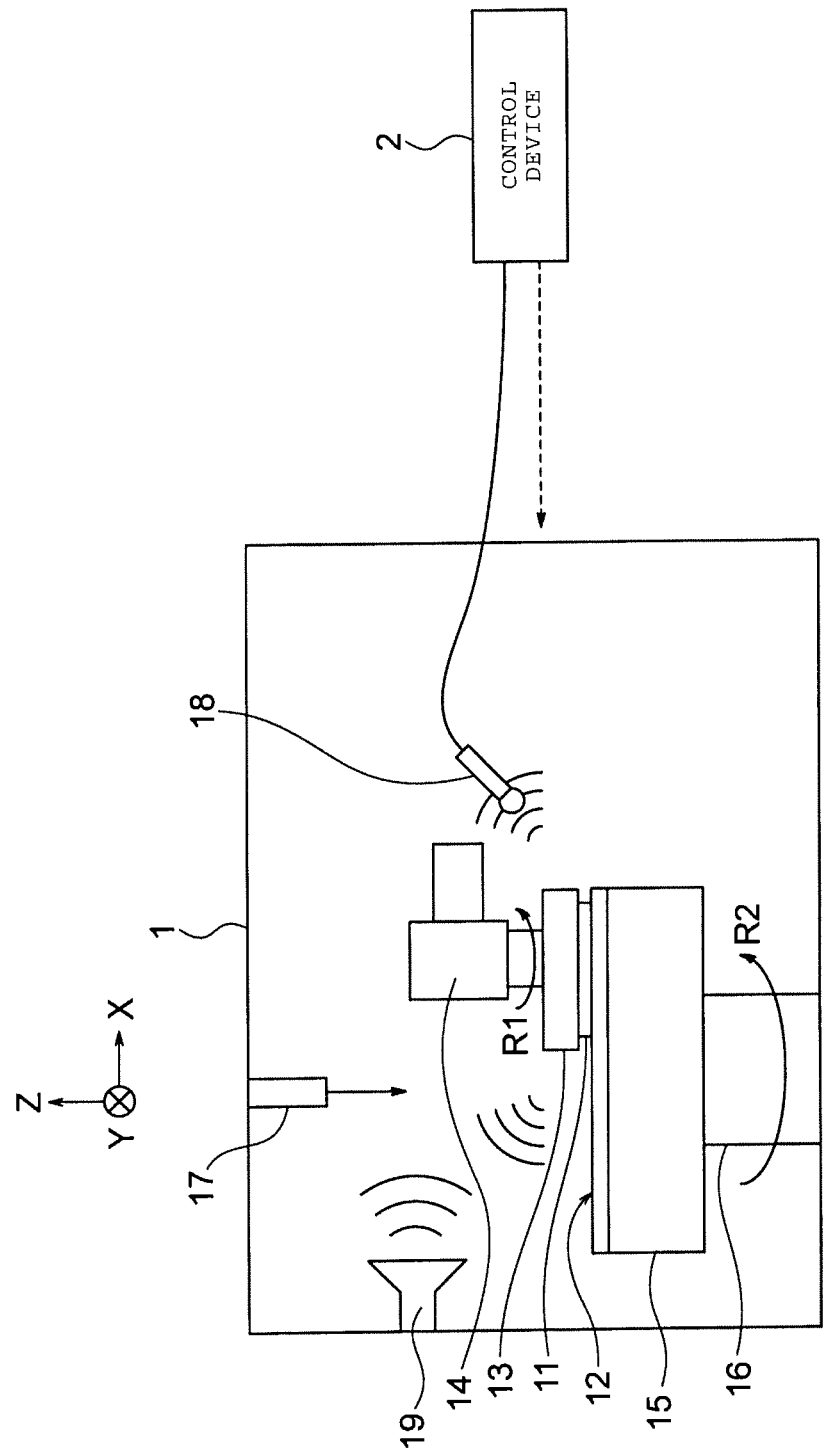

FIG. 5 is a sectional view schematically illustrating a configuration of a semiconductor manufacturing system according to some embodiments.

Figure 6:
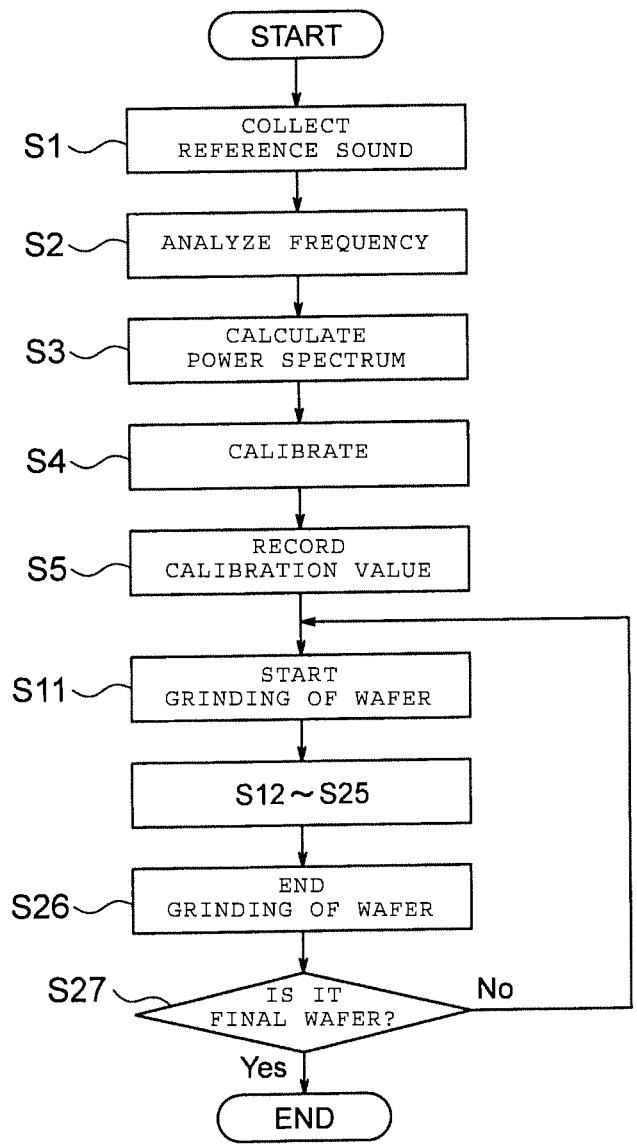

FIG. 6 is a flowchart illustrating an end point detecting method according to some embodiments.

Figure 7:
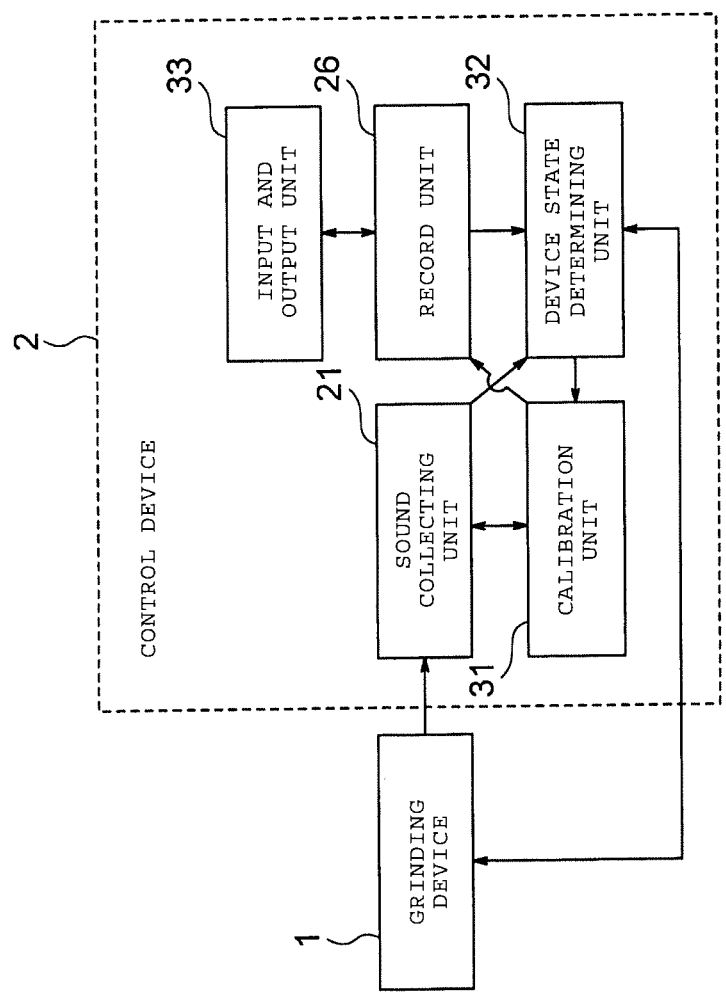

FIG. 7 is a block diagram illustrating a configuration of a control device according to some embodiments.

Figure 8A:
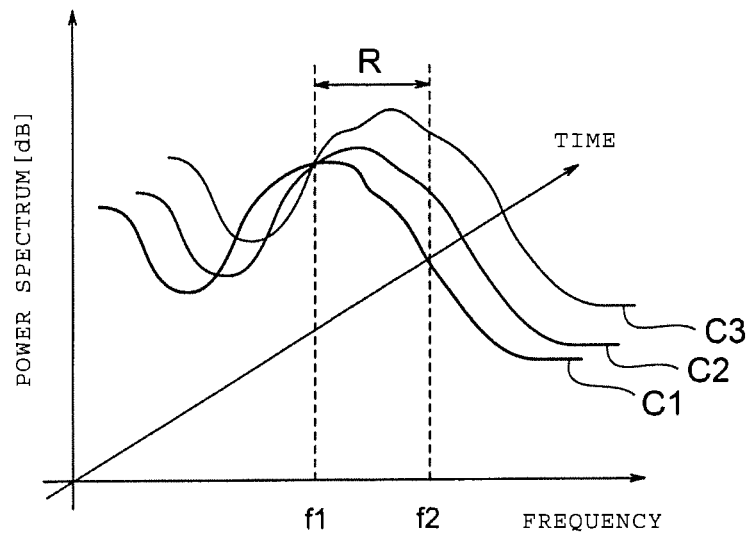
Figure 8B:
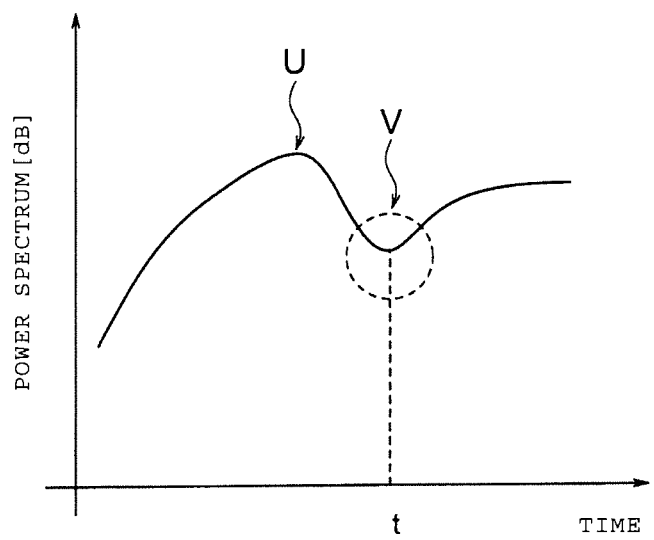

FIG. 8A and FIG. 8B are graphs illustrating an end point detecting method according to some embodiments.

Figure 9A:
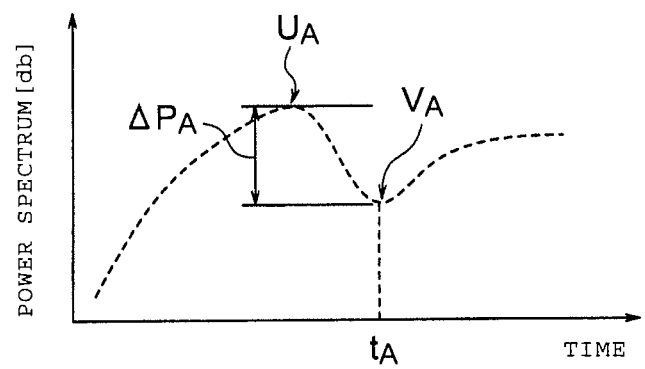
Figure 9B:
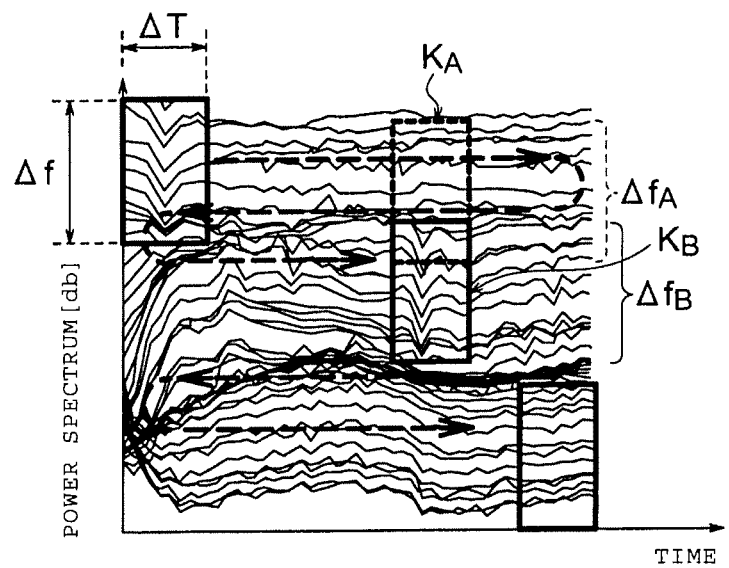
Figure 9C:
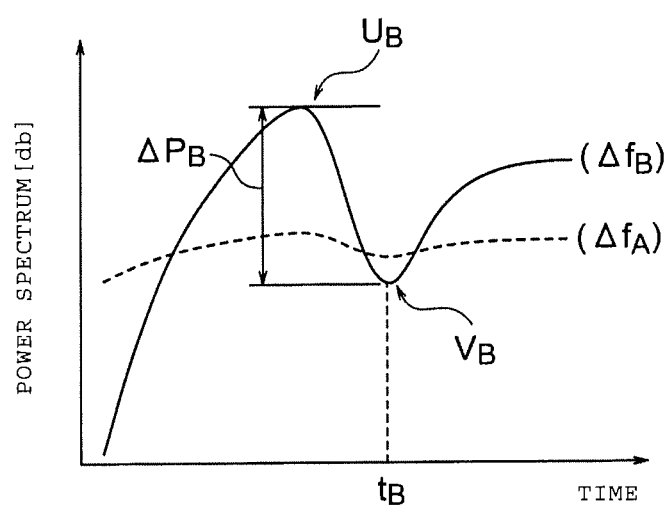

FIG. 9A, FIG. 9B and FIG. 9C are other graphs illustrating the end point detecting method according to some embodiments.

Figure 10:
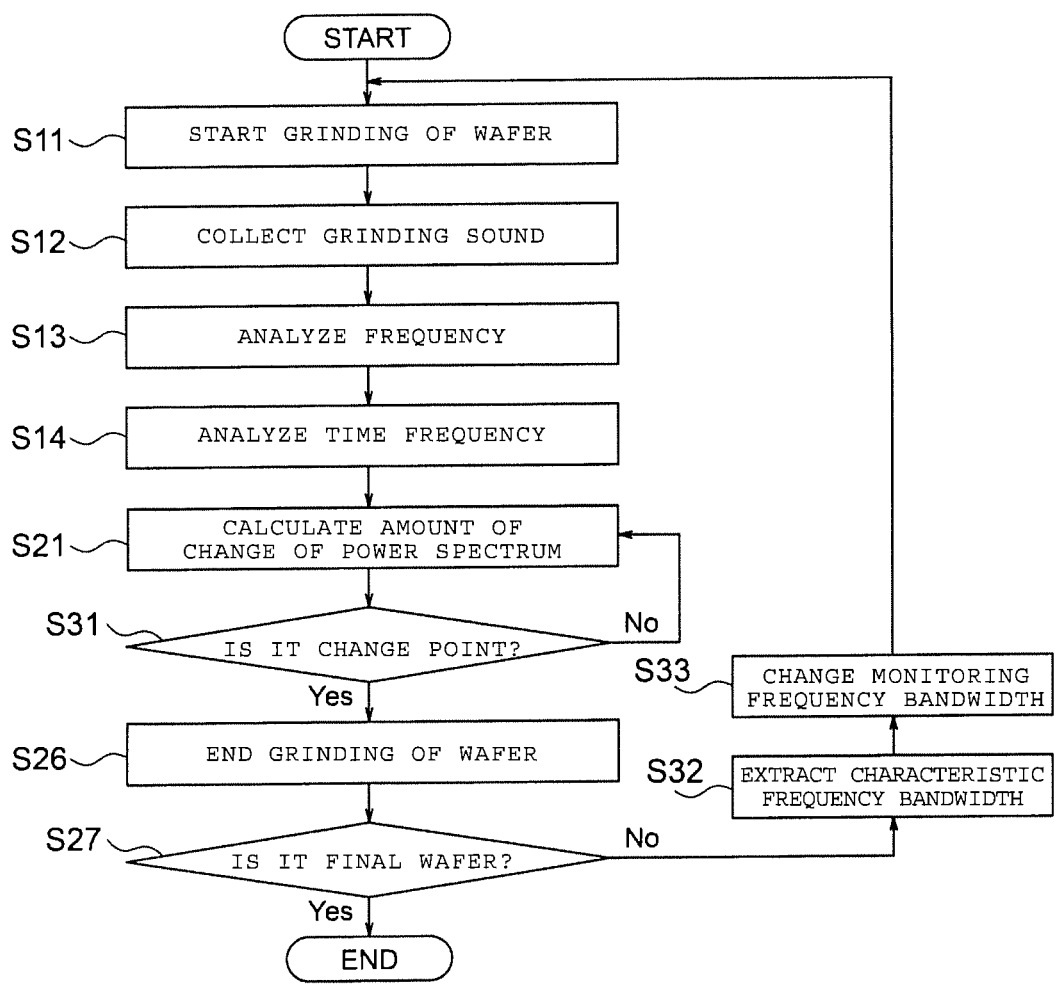

FIG. 10 is a flowchart illustrating the end point detecting method according to some embodiments.

Figure 11:
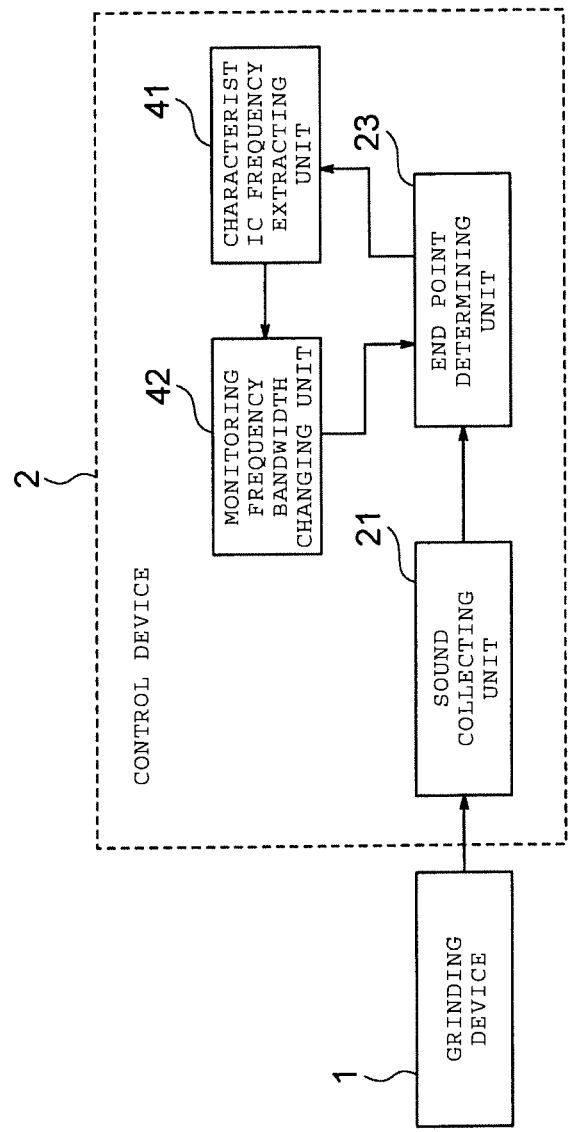

FIG. 11 is a block diagram illustrating a configuration of a control device according to some embodiments.

Figure 1:
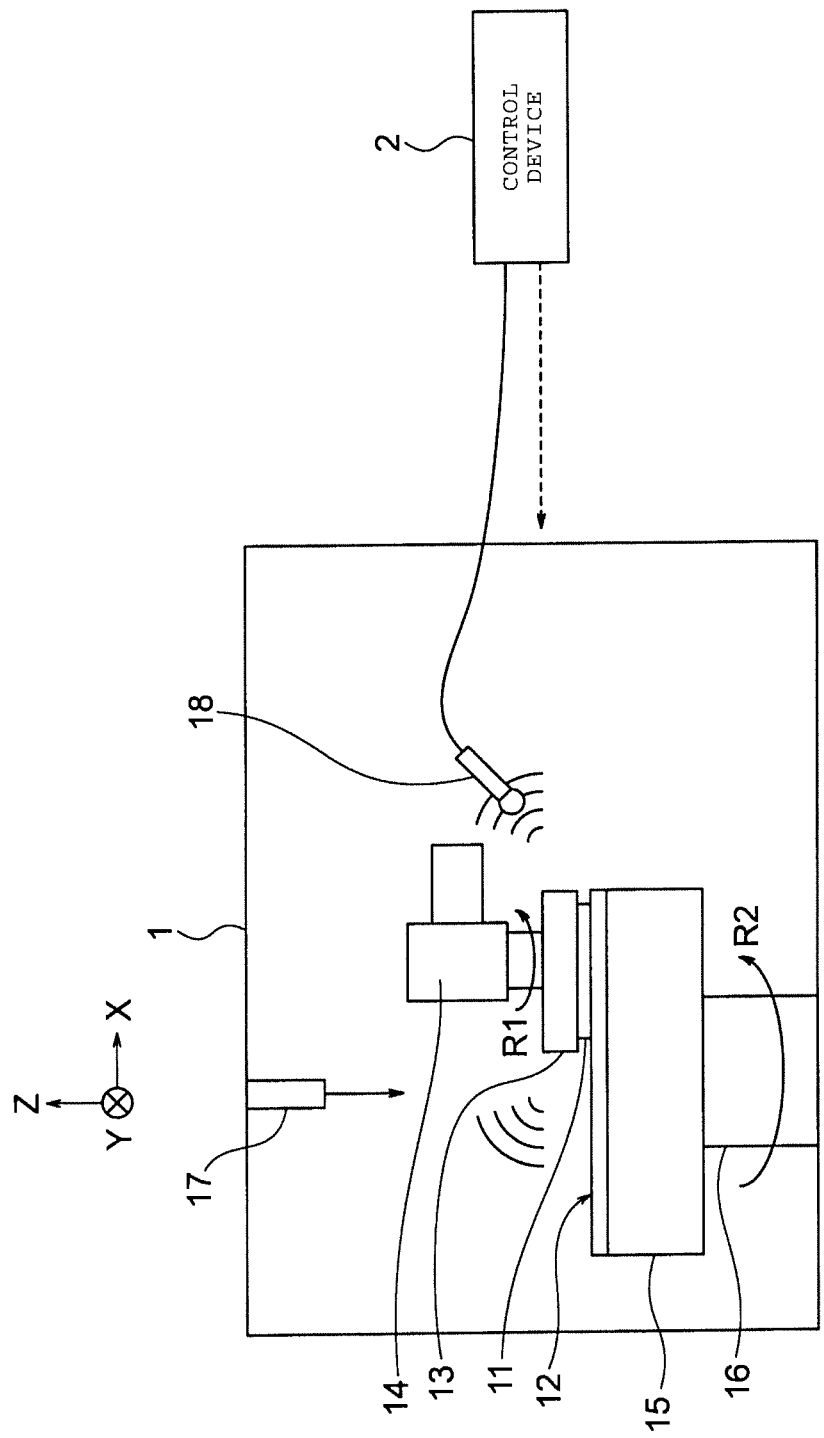
FIG. 1 is a sectional view schematically illustrating a configuration of a semiconductor manufacturing system according to some embodiments.
Figure 12:
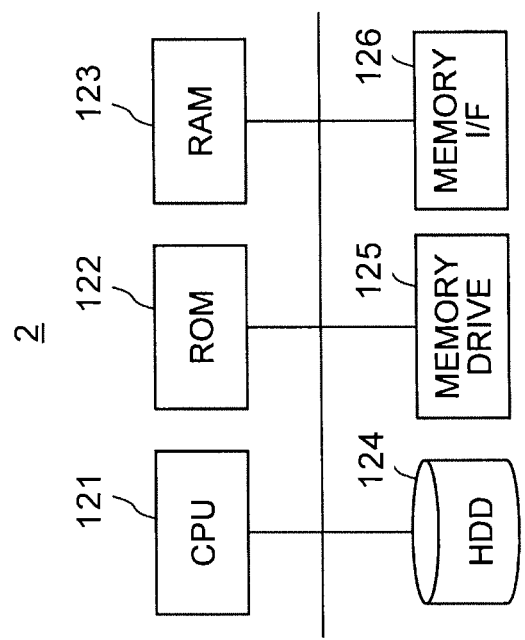

FIG. 12 is a block diagram illustrating a configuration of a control device of FIG. 1.

DETAILED DESCRIPTION

An object of some embodiments is to provide a control device and a control method of a semiconductor manufacturing apparatus which can accurately detect a change point of processing of a substrate using a process sound.

In general, according to some embodiments, a control device of a semiconductor manufacturing apparatus includes a sound collecting unit that collects a sound of processing a substrate by the semiconductor manufacturing apparatus. The control device further includes a change amount calculation unit that calculates an amount of change of a power spectrum of the process sound. The control device further includes a change point determining unit that determines a change point of processing of the substrate based on the amount of change.

Hereinafter, embodiments of the present disclosure will be described with reference to the drawings.

FIG. 1 is a sectional view schematically illustrating a configuration of a semiconductor manufacturing system according to some embodiments.

The semiconductor manufacturing system of FIG. 1 includes a grinding device 1 which grinds a surface of a wafer (e.g., a substrate) 11 using a grinding pad 12, and a control device 2 which controls an operation of the grinding device 1. In some embodiments, the grinding device 1 includes a grinding head 13, a drive unit 14, a grinding table 15, a rotation unit 16, a slurry supplying unit 17, and a sound sensor 18. The grinding device 1 is an example of a semiconductor manufacturing apparatus. The control device 2 is an example of a control device of the semiconductor manufacturing apparatus. The grinding device 1 according to some embodiments is a chemical mechanical polishing (CMP) device.

FIG. 1 illustrates an X direction and a Y direction which are parallel to an installation surface of the grinding device 1 and are perpendicular to each other, and a Z direction which is perpendicular to the installation surface of the grinding device 1. In some embodiments of the present disclosure, the +Z direction is referred to as an upper direction, and the −Z direction is referred to as a lower direction. For example, a relationship between the wafer 11 and the grinding pad 12 can be described such that the grinding pad 12 is located under the wafer 11 (e.g., located apart from the wafer 11 in the −Z direction). In some embodiments, the −Z direction may coincide with the direction of gravity. In other embodiments, the −Z direction may not coincide with the direction of gravity. By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

In some embodiments, the grinding head 13 can hold the wafer 11 downwardly. The drive unit 14 is connected to the grinding head 13, and drives the grinding head 13. In some embodiments, the grinding table 15 can hold the grinding pad 12 upwardly. The rotation unit 16 is connected to the grinding table 15, and rotates the grinding table 15. In some embodiments, the slurry supplying unit 17 can supply slurry on the surface of the grinding pad 12.

In some embodiments, the grinding device 1 can rotate the wafer 11 using the drive unit 14, rotate the grinding pad 12 using the rotation unit 16, and supply the slurry from the slurry supplying unit 17 to the surface of the grinding pad 12. An arrow R1 indicates a rotation direction of the wafer 11 or the grinding head 13. An arrow R2 indicates a rotation direction of the grinding pad 12 or the grinding table 15. In some embodiments, the grinding device 1 can press the wafer 11 on the grinding pad 12 using the drive unit 14. Accordingly, the surface of the wafer 11 is ground by the grinding pad 12. In some embodiments, operations of the grinding head 13, the drive unit 14, the grinding table 15, the rotation unit 16, and the slurry supplying unit 17 are controlled by the control device 2.

In some embodiments, the sound sensor 18 collects a grinding sound of the wafer 11 which is generated by the grinding device 1, and outputs collected results of the grinding sound to the control device 2. The sound sensor 18 is, for example, a microphone. The grinding sound is an example of a sound of processing a substrate by a semiconductor manufacturing apparatus. In some embodiments, an operation of the sound sensor 18 is controlled by the control device 2.

FIG. 2A, FIG. 2B, FIG. 2C and FIG. 2D are graphs illustrating an end point detecting method according to some embodiments.

Figure 2A:
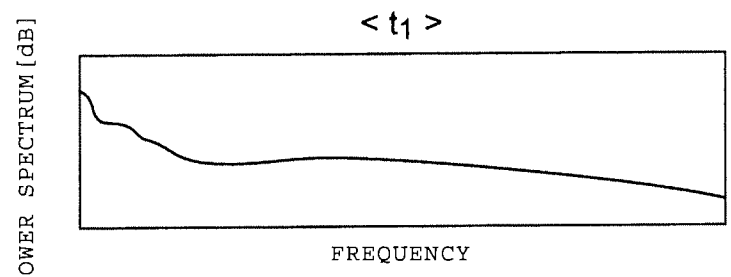
FIG. 2A, FIG. 2B, FIG. 2C and FIG. 2D are graphs illustrating an end point detecting method according to some embodiments.

FIG. 2A illustrates a power spectrum of the grinding sound in a point of time $t_1$. A horizontal axis of FIG. 2A represents a frequency of the grinding sound. A vertical axis of FIG. 2A represents the power spectrum of the grinding sound, that is, power of the grinding sound for each frequency. In some embodiments, the control device 2 collects the grinding sound from the sound sensor 18, and calculates the power spectrum of the point of time $t_1$ based on the collected grinding sound. The control device 2 also calculates the power spectrum in a point of time other than the point of time $t_1$ in the same manner as above.

Figure 2B:
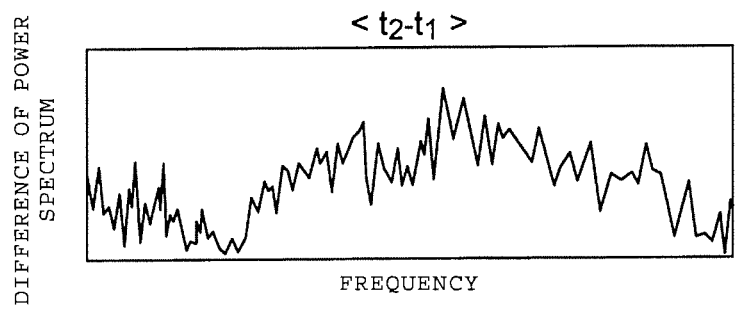

FIG. 2B illustrates the amount of change of the power spectrum of the grinding sound in a time period between the point of time $t_1$ and a point of time $t_2$. A horizontal axis of FIG. 2B represents the frequency of the grinding sound. A vertical axis of FIG. 2B represents the amount of change of the power spectrum of the grinding sound, that is, the amount of change of the power of the grinding sound for each frequency. In some embodiments, the control device 2 subtracts the power spectrum in the point of time $t_2$ from the power spectrum in the point of time $t_1$, thereby calculating the amount of change of the power spectrum in the time period between the point of time $t_1$ and the point of time $t_2$. In some embodiments, the control device 2 sets a difference between the point of time $t_1$ and the point of time $t_2$ to a unit time, thereby calculating the amount of change of the power spectrum per unit time. The control device 2 also calculates the amount of change in a time period other than the time period between the point of time $t_1$ and the point of time $t_2$, in the same manner as above.

Figure 2C:
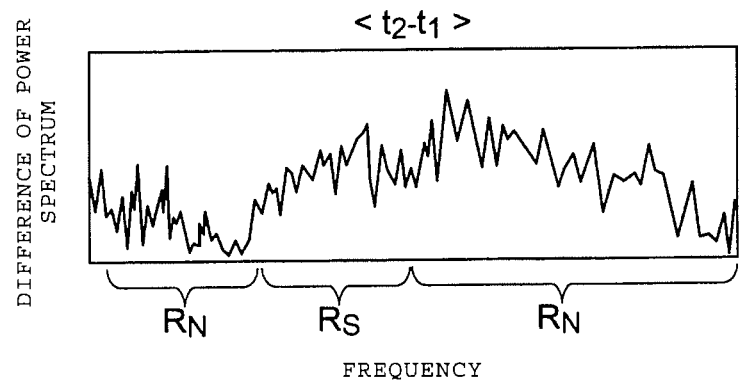

FIG. 2C illustrates a signal frequency bandwidth $R_S$ and a noise frequency bandwidth $R_N$ in the amount of change of the power spectrum in the time period between the point of time $t_1$ and the point of time $t_2$. In some embodiments, the control device 2 obtains an average of the amount of change of the power of the grinding sound in the signal frequency bandwidth $R_S$, thereby calculating an average value of the amount of change of the power spectrum in the signal frequency bandwidth $R_S$. The signal frequency bandwidth $R_S$ is an example of a first frequency bandwidth, and an average value thereof is an example of a first value. In some embodiments, the control device 2 obtains an average of the amount of change of the power of the grinding sound in the noise frequency bandwidth $R_N$, thereby calculating an average value of the amount of change of the power spectrum in the noise frequency bandwidth $R_N$. The noise frequency bandwidth $R_N$ is an example of a second frequency bandwidth, and an average value thereof is an example of a second value. The control device 2 also calculates the average value in a time period other than the time period between the point of time $t_1$ and the point of time $t_2$, in the same manner as above.

Figure 2D:
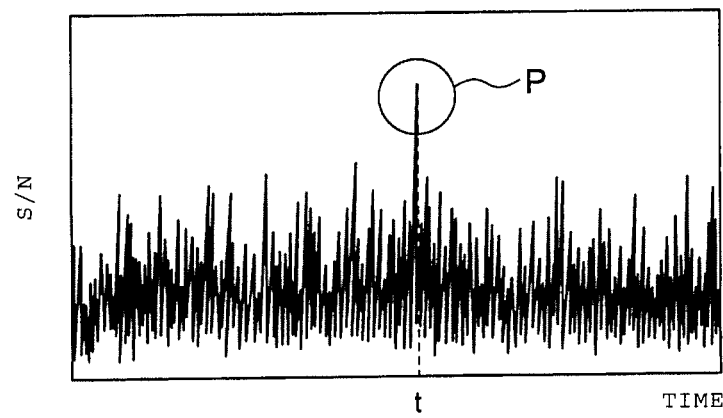

FIG. 2D illustrates a time change of an S/N ratio (signal to noise ratio) of the grinding sound. A horizontal axis of FIG. 2D represents time. A vertical axis of FIG. 2D represents the S/N ratio per unit time. In some embodiments, the control device 2 divides the average value in the signal frequency bandwidth $R_S$ by the average value in the noise frequency bandwidth $R_N$, thereby calculating an S/N ratio per unit time. For example, an S/N ratio per unit time in the point of time $t_2$ is calculated by calculating an S/N ratio in the time period between the point of time $t_1$ and the point of time $t_2$ from an average value in the time period between the point of time $t_1$ and the point of time $t_2$ and setting a difference between the point of time $t_1$ and the point of time $t_2$ to the unit time.

In some embodiments, the control device 2 determines an end point of grinding of the wafer 11 based on the S/N ratio. In some embodiments, in a case where the S/N ratio reaches a threshold value at a certain time t, the control device 2 determines that the time t is the end point of grinding (refer to a circled line P of FIG. 2D. Accordingly, the control device 2 can detect the end point of grinding based on the amount of change of the power spectrum of the grinding sound. In a case where the end point of grinding is detected, the control device 2 controls an operation of the grinding device 1 such that grinding of the wafer 11 is stopped. For example, in a case where the end point of grinding is detected, the control device 2 controls the grinding device 1 to lift the wafer 11 and separate the wafer 11 from the grinding pad 12.

In some embodiments, the control device 2 includes a sound collecting unit configured to perform a function of collecting the grinding sound, among the functions of the control device 2. In some embodiments, the control device 2 includes a change amount calculating unit configured to perform the function of calculating the amount of change, the average value, and the S/N ratio. In some embodiments, the control device 2 includes a change point determining unit configured to perform the function of determining the endpoint of grinding. In some embodiments, the control device 2 includes an end controlling unit configured to perform the function of controlling the grinding device 1 such that grinding is stopped. Details of such functions will be described with reference to FIG. 3 and FIG. 4.

Figure 3:
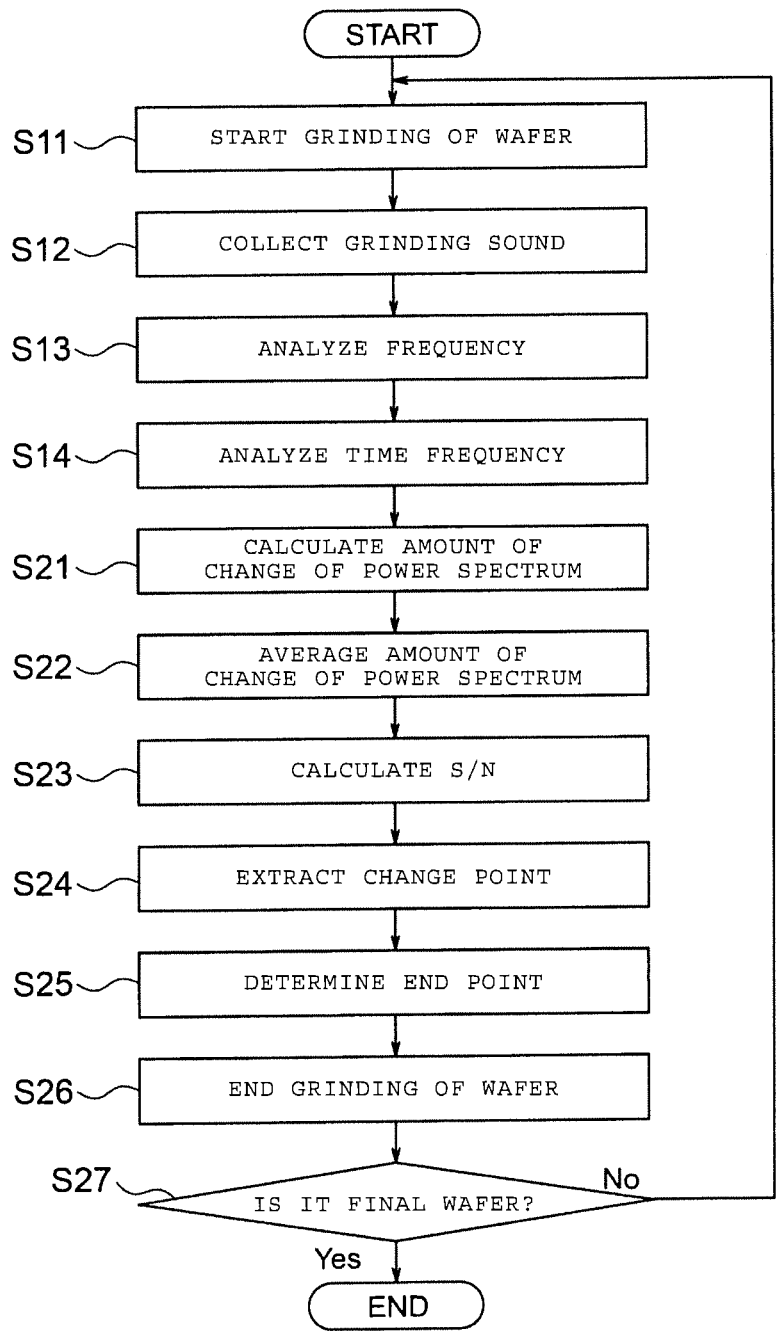
FIG. 3 is a flowchart illustrating the end point detecting method according to some embodiments.

FIG. 3 is a flowchart illustrating the end point detecting method according to some embodiments. In some embodiments, the method is performed by the control device 2.

First, the grinding device 1 starts grinding of the wafer 11 (step S11). Subsequently, the grinding sound of the wafer 11 is collected from the sound sensor 18 (step S12). Subsequently, in some embodiments, frequency analysis (e.g., fast fourier transform (FFT)) is performed on the collected grinding sound (step S13). In some embodiments, time-frequency analysis is performed on the collected grinding sound (step S14). As a result, the power spectrum of the grinding sound illustrated in FIG. 2A is calculated.

Subsequently, the amount of change of the power spectrum per unit time (for example, the graph illustrated in FIG. 2E) is calculated (step S21). In some embodiments, the unit time is an interval of time decomposition at the time of frequency analysis.

Subsequently, the amount of change of the power spectrums in the signal frequency bandwidth $R_S$ and the noise frequency bandwidth $R_N$ is averaged (step S22). As a result, an average value of the amount of change in the signal frequency bandwidth $R_S$ and an average value of the amount of change in the noise frequency bandwidth $R_N$ are calculated. For example, the signal frequency bandwidth $R_S$ and the noise frequency bandwidth $R_N$ are illustrated in FIG. 2C. A method of averaging according to some embodiments may include a method of calculating a moving average, or may be other methods.

If the grinding of the wafer 11 reaches the end point, a grinding sound having a characteristic frequency is generated from the wafer 11. Here, the control device 2 according to some embodiments detects a grinding sound having a characteristic frequency or a frequency near the frequency as a signal, and detects a grinding sound having other frequencies as noise, and thereafter, calculates an S/N ratio based on the signal and the noise, and determines an endpoint of the grinding based on the S/N ratio. The reason is that, if the grinding of the wafer 11 reaches the end point, a ratio of a signal to the grinding sound increases and the S/N ratio increases. In some embodiments, a bandwidth with a characteristic frequency is set as the signal frequency bandwidth $R_S$, other bandwidths are set as the noise frequency bandwidth $R_N$, and the S/N ratio is calculated by using the bandwidths.

The characteristic frequencies are changed according to a type of the wafer 11. For example, a characteristic frequency in a case where a silicon oxide film on the wafer 11 is ground is different from a characteristic frequency in a case where a silicon nitride film on the wafer 11 is ground. Hence, in some embodiments, an upper limit and a lower limit of the signal frequency bandwidth $R_S$ are stored in a database in advance for each type of the wafer 11. In a case where a certain wafer 11 is ground, the control device according to some embodiments acquires identification information of the wafer 11, reads the upper limit and the lower limit corresponding to the identification information, sets the signal frequency bandwidth $R_S$ based on the upper limit and the lower limit, and sets other bandwidths as the noise frequency bandwidth $R_N$. The identification information is an example of information on the substrate.

Subsequently, in some embodiments, the S/N ratio per unit time is calculated based on the average value in the signal frequency bandwidth $R_S$ and the average value in the noise frequency bandwidth $R_N$ (step S23). For example, the S/N ratio is illustrated in FIG. 2D.

Subsequently, in some embodiments, a change point of the grinding is extracted based on the S/N ratio (step S24), and the change point is determined to be the end point of the grinding (step S25). In some embodiments, the time t when the S/N ratio reaches the threshold value is extracted as the change point, and the time t is determined to be the end point of the grinding. In a case where the end point of the grinding is detected, the grinding of the wafer 11 which is performed by the grinding device 1 ends (step S26).

Thereafter, in some embodiments, the control device 2 repeatedly performs processing of steps S11 to S26 with respect to the entire wafers 11 of the amount of one lot (step S27). In other words, in step S27, the control device 2 determines whether the current wafer is a final wafer of the same lot, and when determining that the current wafer is not the final wafer of the same lot, continues to perform processing of steps S11 to S26 with respect to a next wafer of the same lot. The wafers 11 of the same lot (e.g., the same batch) generally have the same characteristic frequency, and thus, processing for the wafers 11 in step S22 is normally performed by using the same upper limit and lower limit. Accordingly, grinding of the wafers 11 of the amount of one lot is performed.

The end point of the grinding is detected by using, for example, a torque current value. In this case, the current value is smoothed before and after differentiation of the current value, and thus, it is possible to increase accuracy of detection of the end point. Meanwhile, in a case where the endpoint is detected by using the grinding sound, the grinding sound contains a signal and noise which are mixed with each other, and thus, even in this case, smoothing (e.g., movement averaging) of the grinding sound is mostly performed. If the smoothing of the grinding sound is performed, there is a possibility that detection of the end point is delayed or the end point is unable to be detected.

Hence, in some embodiments, the end point of the grinding is determined based on the amount of change of the power spectrum of the grinding sound. For example, according to some embodiments, the S/N ratio per unit time is calculated from the amount of change, the endpoint is determined by using the S/N ratio per unit time, and thus, it is possible to detect the end point without using the smoothing. Thus, according to some embodiments, it is possible to reduce a possibility that the detection of the end point is delayed, and a possibility that the end point is unable to be detected, and to reliably detect the end point in a short time.

FIG. 4 is a block diagram illustrating a configuration of the control device 2 according to some embodiments.

As illustrated in FIG. 4, the control device 2 includes a sound collecting unit 21, a characteristic extraction unit 22, an endpoint determining unit 23, an output unit 24, a frequency bandwidth determining unit 25, and a record unit 26.

In some embodiments, the sound collecting unit 21 performs the processing of step S12. For example, the sound collecting unit 21 collects the grinding sound of the wafer 11 from the sound sensor 18.

In some embodiments, the characteristic extraction unit 22 performs processing of steps S13 to S23. For example, the characteristic extraction unit 22 calculates the power spectrum, the amount of change, the average value, and the S/N ratio.

In some embodiments, the end point determining unit 23 performs the processing of steps S24 and S25. For example, the endpoint determining unit 23 extracts the change point of the grinding based on the S/N ratio, and determines that the change point is the end point of the grinding.

In some embodiments, the output unit 24 performs the processing of steps S11 and S26. For example, the output unit 24 controls the grinding device 1 such that the grinding of the wafer 11 starts and ends. In a case where the endpoint of the grinding is detected by the end point determining unit 23, the output unit 24 ends the grinding of the wafer 11 which is performed by the grinding device 1.

In some embodiments, the frequency bandwidth determining unit 25 outputs the setting information of the signal frequency bandwidth $R_S$ and the noise frequency bandwidth $R_N$ to the characteristic extraction unit 22, according to a request from the characteristic extraction unit 22. In some embodiments, if the identification information of the wafer which is a grinding target is acquired from the characteristic extraction unit 22, the frequency bandwidth determining unit 25 reads master information from the record unit 26 so as to set the signal frequency bandwidth $R_S$ and the noise frequency bandwidth $R_N$ of the wafer 11, and outputs the setting information corresponding to the master information to the characteristic extraction unit 22. For example, the master information is an upper limit and a lower limit of the signal frequency bandwidth $R_S$.

In some embodiments, the identification information may be any information that can identify the wafer 11. For example, the identification information is recipe information on products to be manufactured from the wafer 11.

In some embodiments, an upper limit and a lower limit of the master information can be set by collecting in advance the grinding sound of the wafer 11 which is performed by the grinding device 1, and picking up a frequency bandwidth in which the power spectrum changes the largest at the endpoint of the grinding. In some embodiments, the frequency bandwidth can be picked up by, for example, recording standard deviation of the power spectrum for each time, roughly estimating a time period of the end point from a grinding rate of the wafer 11, and investigating a change of the standard deviation of the time period.

In some embodiments, the upper limit and the lower limit of the master information may be set by a single set of values with respect to the wafer 11 of one type, or may be set by multiple sets of values with respect to the wafer 11 of one type. In a case of the latter, the control device 2 may select automatically an upper limit and a lower limit for grinding of the wafer 11, according to a state or an environment of the grinding device 1, when a certain wafer 11 is ground. This is also applied to other master information.

In some embodiments, the record unit 26 is used to record, for example, the identification information or the master information of the wafer 11 that is previously ground or the wafer 11 which is planned to be ground hereafter. In some embodiments, the control device 2 may include an input and output unit for newly registering, updating, and editing the identification information or the master information. The control device 2 according to some embodiments can automatically specify the master information of the wafer 11 based on the identification information, and can automatically set the signal frequency bandwidth $R_S$ and the noise frequency bandwidth $R_N$ of the wafer 11 based on the master information, if the identification information of a certain wafer 11 is acquired. Hence, in some embodiments, even in a case where the type of the wafer 11 which is a grinding target is replaced, the control device 2 can automatically change the signal frequency bandwidth $R_S$ and the noise frequency bandwidth $R_N$ without involvement or input by a user.

As described above, in some embodiments, the end point of the grinding can be determined based on the amount of change of the power spectrum of the grinding sound. Hence, according to some embodiments, the end point of the grinding can be detected quickly and reliably using the grinding sound. In some embodiments, one or more elements of the control device 2 can be implemented in hardware using associated circuits, such as a sound collecting circuit, a characteristic extraction circuit, an end point determining circuit, an output circuit, and a frequency bandwidth determining circuit. The record unit 26 can be implemented using, for example, a memory.

FIG. 5 is a sectional view schematically illustrating a configuration of a semiconductor manufacturing system according to some embodiments.

The semiconductor manufacturing system of FIG. 5 includes a grinding device 1 and a control device 2. The grinding device 1 includes a calibration speaker 19 in addition to the configuration elements illustrated in FIG. 1.

In some embodiments, the calibration speaker 19 generates a reference sound (e.g., test sound) for calibrating a sound sensor 18. An operation of the calibration speaker 19 is controlled by the control device 2. In some embodiments, the sound sensor 18 collects a grinding sound and the reference sound, and outputs collected results of the sound to the control device 2. The collected results are collected by a sound collecting unit 21 of the control device 2. In some embodiments, the control device 2 calibrates the sound sensor 18 based on the collected reference sound.

In a case where the sound sensor 18 is calibrated by the reference sound, a sound pressure of the reference sound can be used for calibration. In this case, the reference sound with a predetermined sound pressure can be generated from the calibration speaker 19, the reference sound can be collected by the sound sensor 18, the control device 2 can determine whether or not the sound pressure of the collected reference sound is a defined sound pressure, and thereby the sound sensor 18 can be calibrated. The collected sound pressure can be changed by a state of the grinding device 1, an environment of the grinding device 1, a frequency of the grinding sound, or the like. Accordingly, in a case where the sound sensor 18 is calibrated by the sound pressure, correct calibration may be difficult to perform, and accuracy of detection of the end point may decrease. In addition, in a case where the end point of the grinding is detected based on the power spectrum of the grinding sound, correct detection of the frequency of the grinding sound can be desired.

In some embodiments, a frequency of the reference sound is used for calibration. In some embodiments, a reference sound with a predetermined frequency is generated from the calibration speaker 19, the reference sound is collected by the sound sensor 18, the control device 2 determines whether or not a frequency of the collected reference sound is a defined frequency, and thereby the sound sensor 18 is calibrated. Accordingly, correct calibration can be performed, and accuracy of the detection of the end point can be increased.

In a case where the sound sensor 18 is calibrated by the sound pressure, a frequency of the reference sound can be mainly set to a frequency of an audible range. Meanwhile, a characteristic frequency at the end point of the grinding is set to be higher than the frequency of the audible range, and can be equal to or higher than, for example, 10 kHz. In some embodiments, when the sound sensor 18 is calibrated to detect the end point, the frequency of the reference sound can be set higher than the frequency of the audible range. Thereby, it is possible to perform calibration suitable for detecting the end point, and to reduce a measurement error of the frequency when the end point is detected.

The frequency of the reference sound according to some embodiments may be one value or multiple values, and may be spread in a certain bandwidth. In addition, the frequency of the reference sound may be changed according to a change of a state or an environment of the grinding device 1. Thereby, it is possible to perform calibration in a state or an environment in which the end point is detected, and to further reduce a measurement error of the frequency when the end point is detected.

FIG. 6 is a flowchart illustrating an end point detecting method according to some embodiments. The method is performed by the control device 2.

First, in some embodiments, the reference sound is generated by the calibration speaker 19, and the reference sound is collected by the sound sensor 18, before grinding of the wafer 11 starts (step S1). The control device 2 according to some embodiments automatically selects the upper limit and the lower limit of the signal frequency bandwidth $R_S$ according to a state or an environment of the grinding device 1, automatically selects a frequency of the reference sound according to the upper limit and the lower limit, and generates the reference sound selectively for a predetermined time using a constant sound pressure. The state or the environment of the grinding device 1 are, for example, a temperature around the grinding device 1 or sound collecting conditions of the grinding device 1. The frequency of the reference sound is, for example, a frequency corresponding to the upper limit, a frequency corresponding to the lower limit, a median frequency of the upper limit and the lower limit, or the like.

In some embodiments, the control device 2 may select the frequencies of the reference sounds of N types or values (N is an integer equal to or greater than 2) in step S1. In this case, the control device 2 sequentially generates the reference sounds of the frequencies of N types. The reference sounds of each frequency may be output selectively for the predetermined time. In some embodiments, the reference sounds of the frequencies of N types are sequentially output with an interval of $\Delta t$. That is, since the output of a certain reference sound ends at the time t, an output of a subsequent reference sound starts at time $t+\Delta t$.

Subsequently, frequency analysis (e.g., FFT) of the collected reference sounds is performed (step S2). Accordingly, a power spectrum of the reference sounds is calculated (step S3). In some embodiments, in a case where the reference sounds of the frequencies of N types are output, the frequency analysis is performed at a resolution of $\Delta t$. The power spectrum is, for example, a decibel (dB) value.

Subsequently, in some embodiments, the sound sensor 18 is calibrated based on the power spectrum of the reference sounds (step S4). The control device 2 according to some embodiments acquires a measurement value of the frequency of the reference sound from the power spectrum of the reference sound, reads a setting value of the frequency of the reference sound from the record unit 26 (refer to FIG. 4), and the sound sensor 18 is calibrated based on the measurement value and the setting value.

For example, the measurement value of the frequency of the reference sound can be acquired by specifying a frequency in which the power spectrum of the reference sound is maximum. In some embodiments, the setting value of the frequency of the reference sound is a frequency which is selected in step S1 (e.g., the selected frequencies of the reference sounds of N types).

In some embodiments, the control device 2 calibrates the sound sensor 18 such that the measurement value is equal to the setting value. In some embodiments, the measurement value is changed by changing the setting of the sound sensor 18, and thereby the sound sensor 18 may be calibrated. In addition, the setting value is changed by updating the setting value in the record unit 26 into the measurement value, and thereby the sound sensor 18 may be calibrated. The control device 2 according to some embodiments calibrates the sound sensor 18 using a method of the latter. The method of the latter has an advantage in which the sound sensor 18 can be calibrated without detaching the sound sensor 18 from the grinding device 1 so as to change the setting of the sound sensor 18.

In some embodiments, the control device 2 includes an acquisition unit configured to perform, among the functions of the control device 2, a function of acquiring the measurement value of the frequency of the reference sound. In some embodiments, the control device 2 includes a read unit configured to perform a function of reading the setting value of the frequency of the reference sound. In some embodiments, the control device 2 includes a calibration unit configured to perform a function of calibrating the sound sensor 18. Details of such elements will be described below with reference to FIG. 7.

Subsequently, in some embodiments, a calibration value of the sound sensor 18 is recorded in the record unit (step S5). The calibration value according to some embodiments is the measurement value of the frequency of the reference sound, and is recorded as a new setting value. In some embodiments, the master information of the upper limit and the lower limit of the signal frequency bandwidth $R_S$ is also updated based on the new setting value. For example, in a case where the setting value increases by 20 Hz, the upper limit and the lower limit of the signal frequency bandwidth $R_S$ also increase by 20 Hz.

In some embodiments, the control device 2 may also collect background noise of a background when the sound sensor 18 is calibrated, in step S1. In this case, in some embodiments, the control device 2 calculates a difference between the reference sound and the background noise, and performs frequency analysis with respect to the difference, in step S2. Accordingly, calibration can be performed with high accuracy even in an environment where background noise exists.

Thereafter, in some embodiments, the processing of steps S11 to S27 is performed in a manner similar to the embodiment as shown in FIG. 3. In some embodiments, the processing of step S22 is performed by using the upper limit and the lower limit which are updated. In some embodiments, in a case where the setting of the upper limit and the lower limit is changed during the grinding of the wafer 11 of the amount of one lot, the processing of the steps S1 to S5 may be performed again before the setting is changed.

FIG. 7 is a block diagram illustrating a configuration of the control device 2 according to some embodiments.

The control device 2 includes a sound collecting unit 21, a record unit 26, a calibration unit 31, a device state determining unit 32, and an input and output unit 33, as illustrated in FIG. 7. In some embodiments, one or more elements of the control device 2 may be implemented in hardware using associated circuits, such as a calibration circuit, a device state determining unit circuit, and an input and output unit circuit. The control device 2 according to some embodiments may also include the characteristic extraction unit 22, the end point determining unit 23, the output unit 24, and the frequency bandwidth determining unit 25, in the same manner as the control device 2 according to the embodiments as shown in FIG. 4, and configuration elements thereof are not illustrated in FIG. 7.

Referring to FIG. 6, in step S1, the device state determining unit 32 generates a reference sound from the calibration speaker 19, and the sound collecting unit 21 collects the reference sound from the sound sensor 18. In some embodiments, at this time, the device state determining unit 32 automatically selects the upper limit and the lower limit of the signal frequency bandwidth $R_S$, according to a state or an environment of the grinding device 1, automatically selects a frequency of the reference sound, according to the upper limit and the lower limit, and generates the reference sound selectively for a predetermined time using a constant sound pressure.

Furthermore, the device state determining unit 32 performs the processing of steps S2 and S3. For example, the device state determining unit 32 performs frequency analysis of the reference sound (step S2), and calculates the power spectrum of the reference sound (step S3). In addition, the calibration unit 31 performs the processing of steps S4 and S5. For example, the calibration unit 31 calibrates the sound sensor 18 (step S4), and records a calibration value of the sound sensor 18 in the record unit 26 (step S5).

In some embodiments, the device state determining unit 32 determines a change of the state or the environment of the grinding device 1. For example, the device state determining unit 32 reads the setting value of the frequency of the reference sound from the record unit 26 based on the identification information of the wafer 11 which is a grinding target. In some embodiments, the setting value is used, when the reference sound is generated in step S1, or when the sound sensor 18 is calibrated in step S4. In some embodiments, the device state determining unit 32 acquires information from the grinding device 1 to the effect that a state of the grinding device 1 is changed, and selects the setting value which is read from the record unit 26 based on the information.

A relationship between the change of the state or the environment of the grinding device 1, and the characteristic frequency of the grinding sound is registered in the record unit 26 as the master information in advance. The input and output unit 33 uses the master information, for new registration, updating, and editing.

As describe above, in some embodiments, the sound sensor 18 is calibrated based on the frequency of the reference sound which is collected from the sound sensor 18. Hence, according to some embodiments, it is possible to perform a correct calibration of the sound sensor 18, and to increase accuracy of the detection of the end point.

FIG. 8A and FIG. 8B are graphs illustrating an end point detecting method according to some embodiments. The end point detecting method according to some embodiments is performed by the control device 2 in the semiconductor manufacturing system of FIG. 1.

Curves C1, C2, and C3 of FIG. 8A respectively represent power spectrums of grinding sounds at time t1, t2, and t3. A horizontal axis of FIG. 8A represents the frequency of the grinding sound. A vertical axis of FIG. 8A represents the power spectrum of the grinding sound. An axis in a depth direction of FIG. 8A represents time.

In some embodiments, the control device 2 can calculate an average value of the amount of change of the power spectrum at a predetermined frequency bandwidth R, and can calculate an S/N ratio based on the average value, and can determine the end point based on the S/N ratio. The predetermined frequency bandwidth R is set so as to include the characteristic frequency of the grinding sound which is generated from the wafer 11 when the grinding of the wafer 11 reaches the end point. A symbol f1 represents the frequency of the lower limit of the frequency bandwidth R. A symbol f2 represents the frequency of the upper limit of the frequency bandwidth R. In some embodiments, the control device 2 calculates an average value of the amount of change of the power spectrum within the frequency bandwidth R, divides the average value into an average value of a signal time band and an average value of a noise time band, on a time axis, and calculates the S/N ratio based on the average values.

The wafer 11 includes, for example, a semiconductor substrate, a stopper layer on the semiconductor substrate, and a process target layer on the stopper layer. In this case, in some embodiments, the control device 2 controls the grinding device 1 so as to grind the process target layer, and sets the timing when the process target layer is removed and thereby the stopper layer is exposed, as the end point. If the grinding reaches the end point, a characteristic change occurs at the power spectrum of the grinding sound due to a different selection ratio between the process target layer and the stopper layer. For example, the power spectrum of a certain frequency is maximum or minimum at the end point. The frequency bandwidth R is set so as to include the frequency.

FIG. 8B illustrates a power spectrum of the frequency. A horizontal axis of FIG. 8B represents time. A vertical axis of FIG. 8B represents a power spectrum of the grinding sound. A symbol U represents a maximum of the power spectrum. A symbol V represents a minimum of the power spectrum. FIG. 8B illustrates that the grinding reaches the end point at time t and the power spectrum reaches the minimum V at the time t.

The characteristic frequency (or frequency bandwidth) can be changed by a state of an element of the grinding device 1, or a state of a consumable member such as the grinding pad 12 or a grinding dresser. For example, the frequency changes toward a high frequency side or a low frequency side, and the frequency bandwidth changes into a broad bandwidth or a narrow bandwidth. Accordingly, if the frequency bandwidth R is fixed, detection accuracy of the end point varies in each wafer 11, and correct detection of the end point can be difficult.

Hence, the control device 2 according to some embodiments determines the end point by setting the predetermined frequency bandwidth R to a first bandwidth $\Delta f_A$ (see FIG. 9B), when a certain wafer 11 (first wafer 11) is ground. Furthermore, the control device 2 according to some embodiments determines a second bandwidth $\Delta f_B$ (see FIG. 9B) as new setting of the frequency bandwidth R based on the grinding sound which is collected when the first wafer 11 is ground. Furthermore, the control device 2 according to some embodiments determines the end point by changing the frequency bandwidth R to the second bandwidth $\Delta f_B$, when a next wafer 11 (second wafer 11) is ground.

As described above, the control device 2 according to some embodiments corrects the frequency bandwidth R when the next wafer 11 is ground based on the grinding sound which is collected when a certain wafer 11 is ground. The control device 2 according to some embodiments can correct the frequency bandwidth R by changing an upper limit (f2) and a lower limit (f1) of the master information.

In some embodiments, the control device 2 includes a determination unit configured to perform, among the functions of the control device 2, the function of determining the new setting of the frequency bandwidth R. In some embodiments, the control device 2 includes a change unit configured to perform the function of changing the frequency bandwidth R according to the new setting. Details of such functions will be described with reference to FIG. 9A to FIG. 11.

FIG. 9A, FIG. 9B and FIG. 9C are other graphs illustrating the end point detecting method according to some embodiments.

FIG. 9A illustrates a power spectrum of the grinding sound which is collected when the first wafer 11 is ground. Specifically, FIG. 9A illustrates a time transition waveform of a power spectrum of the characteristic frequency, in the same manner as in FIG. 8B. The frequency is included in the first bandwidth $\Delta f_A$. Symbols $U_A$, $V_A$, and $t_A$ respectively represent a maximum, a minimum, and the end point. A symbol $\Delta P_A$ represents a power difference between the maximum $U_A$ and the minimum $V_A$ of the power spectrum.

FIG. 9B illustrates the power spectrum of the grinding sound which is collected when the first wafer 11 is ground. FIG. 9B also illustrates time transition waveforms of power spectrums of various frequencies. In some embodiments, the control device 2 acquires the time transition waveforms of FIG. 9B by decomposing the time transition waveform of the power of the grinding sound for each frequency. In some embodiments, the control device 2 generates first image data in which the time transition waveform is represented as a two-dimensional image.

In the first image data, a horizontal axis represents time, and a vertical axis represents a power spectrum. The first image data includes time transition waveforms of various frequencies, and each time transition waveform represents a relationship between power spectrums of each frequency and time. Content of the first image data is the same as, for example, the graph illustrated in FIG. 9B. The first image data includes not only the time transition waveforms of the frequencies within the first bandwidth $\Delta f_A$, but also time transition waveforms of other frequencies that the sound sensor 18 can detect. In some embodiments, the control device 2 includes an image generating unit configured to perform the function of generating the first image data.

In some embodiments, the control device 2 holds second image data which is collated with the first image data in advance in the record unit 26 (see FIG. 4). The second image data includes the time transition waveform (e.g., reference waveform) of the characteristic frequency or a frequency near the characteristic frequency. In some embodiments, the reference waveform is the time transition waveform close to the end point of the grinding. A size (e.g., reference space) of the second image data is $\Delta T \times \Delta f$ as illustrated by a rectangular shape in FIG. 9B. In some embodiments, the second image data can be generated by grinding the wafer 11 for testing by the grinding device 1 in advance and collecting the grinding sound at the time of grinding.

In some embodiments, the control device 2 scans the first image data as indicated by an arrow of FIG. 9B, and collates the first image data with the second image data. In some embodiments, the control device 2 extracts an area including an image closest to the second image data from the first image data using a pattern recognition technology.

Referring to FIG. 9B, a symbol $K_A$ represents an area in which the first bandwidth $\Delta f_A$ is set to a vertical width. A symbol $K_B$ represents an area in which the second bandwidth $\Delta f_B$ is set to a vertical width. In some embodiments, in a case where the area $K_B$ is extracted as an area including an image which is the most different from the second image data, the control device 2 determines the second bandwidth $\Delta f_B$ as the new setting of the frequency bandwidth R. In some embodiments, the control device 2 includes an image collating unit configured to perform the function of determining the new setting of the frequency bandwidth R using the image collation.

In some embodiments, the control device 2 may hold the second image data of two types or more. Values of $\Delta T$ and $\Delta f$ may be different from each other. In addition, the pattern recognition technology may be any suitable technology.

FIG. 9C illustrates a power spectrum of the grinding sound which is collected when the second wafer 11 is ground. Specifically, a solid line of FIG. 9C indicates the time transition waveform of the power spectrum of a frequency within the second bandwidth $\Delta f_B$. For comparison, a dashed line of FIG. 9C indicates the time transition waveform of the power spectrum of the frequency within the first bandwidth $\Delta f_A$. Symbols $U_B$, $V_B$, $t_B$, and $\Delta P_B$ respectively represent a maximum, a minimum, an end point, and a power difference.

FIG. 10 is a flowchart illustrating the end point detecting method according to some embodiments.

First, in some embodiments, the grinding of the first wafer 11 starts (step S11), and processing of steps S12 to S14 is performed for the grinding sound of the first wafer 11. Accordingly, the power spectrum of the grinding sound is calculated.

Subsequently, in some embodiments, the amount of change of the power spectrum per unit time is calculated (step S21), and the endpoint (e.g., a change point) of the grinding is determined based on the amount of change in a predetermined frequency bandwidth R (step S31). For example, the endpoint can be determined based on an S/N ratio between a signal time band and a noise time band. In a case where the end point of the grinding is detected, the grinding of the first wafer 11 ends (step S26).

After the grinding of the first wafer 11 ends, a characteristic frequency bandwidth is extracted from the grinding sound of the first wafer 11 (step S32). In some embodiments, the bandwidth $\Delta f_B$ of the aforementioned area $K_B$ is extracted by the collation processing of FIG. 9B.

Subsequently, in some embodiments, a monitoring frequency bandwidth is changed into an extracted bandwidth (step S33). Specifically, the frequency bandwidth R is determined to be the second bandwidth $\Delta f_B$.

Subsequently, in some embodiments, the grinding of the second wafer 11 starts (step S11), and processing after step S12 is performed. At this time, the second bandwidth $\Delta f_B$ is used as the frequency bandwidth R.

The control device 2 repeats the aforementioned processing for the entire wafer 11 of the amount of one lot (step S27). In other words, in step S27, the control device 2 determines whether the current wafer is a final wafer of the same lot, and when determining that the current wafer is not the final wafer of the same lot, continues to perform processing of steps S11 to S26 with respect to a next wafer of the same lot. Accordingly, the grinding of the wafer 11 of the amount of one lot is performed.

FIG. 11 is a block diagram illustrating a configuration of the control device 2 according to some embodiments.

The control device 2 includes the sound collecting unit 21, the end point determining unit 23, a characteristic frequency bandwidth extracting unit 41, and a monitoring frequency bandwidth changing unit 42, as illustrated in FIG. 11. In some embodiments, one or more elements of the control device 2 may be implemented in hardware using associated circuits, such as a characteristic frequency bandwidth extracting circuit and a monitoring frequency bandwidth changing circuit. The control device 2 according to some embodiments also includes the characteristic extraction unit 22, the output unit 24, the frequency bandwidth determining unit 25, and the record unit 26, in the same manner as the control device 2 according to the embodiment as shown in FIG. 4, and the configuration elements are not illustrated in FIG. 11.

In some embodiments, the characteristic frequency bandwidth extracting unit 41 extracts a characteristic frequency bandwidth from the grinding sound in step S32. In some embodiments, the monitoring frequency bandwidth changing unit 42 changes a monitoring frequency bandwidth into the extracted bandwidth in step S33. The control device 2 according to some embodiments corrects the frequency bandwidth R using the configuration elements.

As described above, in some embodiments, the frequency bandwidth R is corrected when the second wafer 11 is ground based on the grinding sound which is collected when the first wafer 11 is ground. For example, the correction is made by collating the first image data with the second image data. Hence, according to some embodiments, sensitivity of the collection of the grinding sound can be increased by correction of the frequency bandwidth R, and thus, it is possible to increase accuracy of the detection of the endpoint.

FIG. 12 is a block diagram illustrating a configuration of the control device 2 of some embodiments, such as the control device 2 of FIG. 1.

In some embodiments, the control device 2 includes a processor (e.g., a central processing unit (CPU)) 121, a read only memory (ROM) 122, a random access memory (RAM) 123, a hard disk drive (HDD) 124, a memory drive 125 such as a compact disc (CD) drive and a digital versatile disk (DVD) drive, and a memory interface (I/F) 126 such as a memory port and a memory slot. Functions of the control device 2 of some embodiments may be implemented as instructions stored in one or more memories and executable by the processor 121.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above-described embodiments can be combined when implemented.

What is claimed is:

1. A control device of a semiconductor manufacturing apparatus, the control device comprising a processor and a memory connected to the processor, the memory storing instructions executable by the processor to:

collect a sound of processing a substrate by the semiconductor manufacturing apparatus;

calculate a difference between a power spectrum of the processing sound at a first point of time and a power spectrum of the processing sound at a second point of time; and determine a change point of processing of the substrate based on the difference, wherein the instructions to calculate the difference include instructions executable by the processor to calculate a first value based on the difference in a first frequency bandwidth, and calculate a second value based on the difference in a second frequency bandwidth, wherein the instructions to determine the change point include instructions executable by the processor to determine the change point based on the first value and the second value, wherein the instructions to calculate the difference include instructions executable by the processor to calculate a signal to noise ratio (S/N ratio) of the processing sound based on the first and second values, and wherein the instructions to determine the change point include instructions executable by the processor to determine the change point based on the S/N ratio.

2. The device according to claim 1, wherein the first value is an average value of the difference in the first frequency bandwidth, and wherein the second value is an average value of the difference in the second frequency bandwidth.

3. The device according to claim 1, wherein the instructions to calculate the difference include instructions executable by the processor to change the first and second frequency bandwidths based on information on the substrate.

4. The device according to claim 1, wherein the instructions to collect the processing sound include instructions executable by the processor to collect, from a sound sensor, the processing sound and a reference sound for calibration of the sound sensor, and the memory further storing instructions executable by the processor to:

acquire a measurement value of a frequency of the reference sound using the collected reference sound, read a setting value of the frequency of the reference sound from a record unit, and calibrate the sound sensor based on the measurement value of the frequency of the reference sound and the setting value of the frequency of the reference sound.

5. The device according to claim 1, wherein the instructions to determine the change point include instructions executable by the processor to determine the change point based on the difference in a predetermined frequency bandwidth, and the memory further storing instructions executable by the processor to:

determine a setting of the predetermined frequency bandwidth based on the processing sound which is collected when a first substrate is processed, and change the predetermined frequency bandwidth according to the setting when a second substrate is processed.

6. The device according to claim 5, wherein the memory further storing instructions executable by the processor to:

generate first image data indicating a relationship between power spectrums of the processing sound, which is collected when the first substrate is processed, and time, and determine the setting of the predetermined frequency bandwidth by collating the first image data with second image data which represents a relationship between a power spectrum of the change point and time.

7. The device according to claim 1, wherein the memory further storing instructions executable by the processor to:

control the semiconductor manufacturing apparatus such that processing of the substrate ends, responsive to detecting the change point.

8. A control method of a semiconductor manufacturing apparatus, the method comprising:

collecting a sound of processing a substrate by the semiconductor manufacturing apparatus;

calculating a difference between a power spectrum of the processing sound at a first point of time and a power spectrum of the processing sound at a second point of time;

determining a change point of processing of the substrate based on the difference;

controlling processing of the substrate by the semiconductor manufacturing apparatus based on the change point;

calculating a first value based on the difference in a first frequency bandwidth;

calculating a second value based on the difference in a second frequency bandwidth;

determining the change point based on the first value and the second value;

calculating a signal to noise ratio (S/N ratio) of the processing sound based on the first and second values; and determining the change point based on the S/N ratio.

9. The control method according to claim 8, wherein the first value is an average value of the difference in the first frequency bandwidth, and wherein the second value is an average value of the difference in the second frequency bandwidth.

10. The control method according to claim 8, further comprising:

changing the first and second frequency bandwidths based on information on the substrate.

11. The control method according to claim 8, further comprising:

collecting, from a sound sensor, the processing sound and a reference sound for calibration of the sound sensor, and acquiring a measurement value of a frequency of the reference sound using the collected reference sound, reading a setting value of the frequency of the reference sound from a record unit, and calibrating the sound sensor based on the measurement value of the frequency of the reference sound and the setting value of the frequency of the reference sound.

12. The control method according to claim 8, further comprising:

determining the change point based on the difference in a predetermined frequency bandwidth, and determining a setting of the predetermined frequency bandwidth based on the processing sound which is collected when a first substrate is processed, and changing the predetermined frequency bandwidth according to the setting when a second substrate is processed.

13. The control method according to claim 12, further comprising:

generating first image data indicating a relationship between power spectrums of the processing sound, which is collected when the first substrate is processed, and time, and determining the setting of the predetermined frequency bandwidth by collating the first image data with second image data which represents a relationship between a power spectrum of the change point and time.

14. The control method according to claim 8, further comprising:

controlling the semiconductor manufacturing apparatus such that processing of the substrate ends, responsive to detecting the change point.

15. A control device of a semiconductor manufacturing apparatus, the control device comprising:

a characteristic extraction circuit to calculate a difference between a power spectrum of a sound of processing a substrate by the semiconductor manufacturing apparatus at a first point of time and a power spectrum of the processing sound at a second point of time; and an end point determining circuit to determine a change point of processing of the substrate based on the difference, wherein the characteristic extraction circuit is configured to calculate a first value based on the difference in a first frequency bandwidth, and calculate a second value based on the difference in a second frequency bandwidth, wherein the end point determining circuit is configured to determine the change point based on the first value and the second value, wherein characteristic extraction circuit is configured to calculate a signal to noise ratio (S/N ratio) of the processing sound based on the first and second values, and wherein the end point determining circuit is configured to determine the change point based on the S/N ratio.

16. The device according to claim 15, further comprising:

an output circuit to control the semiconductor manufacturing apparatus such that processing of the substrate ends, responsive to determining the change point.

* * * * *